(12) United States Patent
Chuang et al.

(10) Patent No.: US 9,997,488 B2
(45) Date of Patent: Jun. 12, 2018

(54) COPPER-BASED ALLOY WIRE AND METHODS FOR MANUFATURING THE SAME

(71) Applicants: Tung-Han Chuang, Taipei (TW); Jun-Der Lee, Taichung (TW); Hsing-Hua Tsai, Taichung (TW)

(72) Inventors: Tung-Han Chuang, Taipei (TW); Jun-Der Lee, Taichung (TW); Hsing-Hua Tsai, Taichung (TW)

( * ) Notice: Subject to any disclaimer, the term of this patent is extended or adjusted under 35 U.S.C. 154(b) by 659 days.

(21) Appl. No.: 14/157,413

(22) Filed: Jan. 16, 2014

(65) Prior Publication Data

US 2014/0209215 A1    Jul. 31, 2014

(30) Foreign Application Priority Data

Jan. 29, 2013    (TW) .............................. 102103254 A (51) Int. Cl.
*H01L 23/00*         (2006.01)

(52) U.S. Cl.
CPC .............. *H01L 24/43* (2013.01); *H01L 24/45* (2013.01); *H01L 2224/4321* (2013.01); *H01L 2224/43848* (2013.01); *H01L 2224/43986* (2013.01); *H01L 2224/45015* (2013.01); *H01L 2224/45147* (2013.01); *H01L 2224/45157* (2013.01); *H01L 2224/45565* (2013.01); *H01L 2224/45644* (2013.01); *H01L 2224/45647* (2013.01); *H01L 2224/45664* (2013.01); *H01L 2224/45669* (2013.01); *H01L 2924/00011* (2013.01); *H01L 2924/12041* (2013.01); *H01L 2924/14* (2013.01)

(58) Field of Classification Search
CPC .. C22C 9/00; H01L 2224/45647; H01L 24/45
USPC .......................................................... 148/432
See application file for complete search history.

(56) References Cited

U.S. PATENT DOCUMENTS

2003/0173659 A1*  9/2003  Lee .......................... H01L 24/03
                                                              257/690
2012/0094121 A1*  4/2012  Uno ........................ B21C 1/003
                                                              428/389

FOREIGN PATENT DOCUMENTS

JP            59139663 A   *  8/1984

OTHER PUBLICATIONS

Lu et al., "Ultrahigh Strength and High Electrical Conductivity in Copper," Science 304(5569), pp. 422-426, Apr. 2004.*

* cited by examiner

*Primary Examiner* — Jie Yang (57) ABSTRACT

A copper-based alloy wire made of a material selected from the group consisting of a copper-gold alloy, a copper-palladium alloy and a copper-gold-palladium alloy is provided. The alloy wire has a polycrystalline structure of a face-centered cubic lattice and consists of a plurality of equi-axial grains. The quantity of grains having annealing twins is 10 percent or more of the total quantity of the grains of the copper-based alloy wire.

16 Claims, 6 Drawing Sheets

COPPER-BASED ALLOY WIRE AND METHODS FOR MANUFATURING THE SAME

CROSS REFERENCE TO RELATED APPLICATIONS

This application claims priority of Taiwan Patent Application No. 102103254, filed on Jan. 29, 2013, the entirety of which is incorporated by reference herein.

BACKGROUND OF THE INVENTION

1. Field of the Invention

The invention relates to copper-based alloy wires and manufacturing methods thereof, and more specifically to copper-based alloy wires utilized for the wire bonding of packages of electronic devices and manufacturing methods thereof.

2. Description of the Related Art

Wire bonding is an extremely important step in the packaging processes of integrated circuit (IC) devices and light-emitting diodes (LED). Bonding wires provide not only signal transmission and power transmission between chips and chip carriers (substrates), but also heat dissipation. Therefore, it is necessary for metal wires for wire bonding to have not only excellent electrical conductivity and thermal conductivity, but also sufficient strength and ductility. It is necessary for the metal wires to have good antioxidative activity and corrosion resistance because the polymer encapsulants for packaging commonly have corrosive chloride ions and hygroscopic properties for absorbing moisture from the environment. Moreover, the metal wire conducts a high volume of heat to the first bond (ball bond) when the ball bond cools from a molten state to room temperature, and thus a heat-affected zone is formed in the metal wire near the ball bond. Grain growth happens to the metal wire in the heat-affected zone due to heat build-up, resulting in the formation of local coarse grains. The local coarse grains result in less strength, and thus the metal wire cracks in the heat-affected zone during the wire pull test, negatively affecting the bonding strength. When completing the packaging processes of the integrated circuit devices or the light-emitting diodes, the high current density through the metal wires can potentially activate atoms in the metal wires and thus generate electron migration during utilization of the packaged products. As a result, holes are formed at the terminal of the metal wires, resulting in a decrease in electrical conductivity and thermal conductivity, and even the occurrence of broken wires.

The bonding wires presently utilized in the electronic industry are mainly pure gold and pure aluminum (referring to George G. Harman, Reliability and Yield Problems of Wire Bonding in Microelectronics, National Institute of Standards and Technology, 1991 by International Society for Hybrid Microelectronics, p. 49-89.). Recently, pure copper wires (referring to US20060186544A1 and U.S. Pat. No. 4,986,856) and composite metal wires such as copper wires with gold plating (referring to U.S. Pat. No. 7,645,522B2), copper wires with palladium plating (referring to US 20030173659A1), copper wires with platinum plating (referring to US 20030173659A1) and aluminum wires with copper plating (referring to U.S. Pat. No. 6,178,623B1) are also being utilized as bonding wires. The internal structure of the conventional metal wires for wire bonding are all equi-axial fine grains. The conventional fine grain structure may provide sufficient tensile strength and ductility. However, there are a lot of high-angle grain boundaries existing between the fine grains. The high-angle grain boundaries scatter the electron transmission, and thus increase the electrical resistivity of the metal wires and simultaneously decrease the thermal conductivity of the metal wires. Additionally, the high-angle grain boundaries have higher interfacial energy and provide favorable paths for environmental oxidation, sulfuration and chloride ion corrosion, lowering the reliability of packaged electronic products. Moreover, the heat-affected zone tends to be formed in the metal wire with a fine grain structure near the first bond (ball bond) during wire bonding. Thus the wire bonding strength is decreased, and electron migration tends to occur to the metal wire with a fine grain structure during the utilization of packaged semiconductor devices or light-emitting diodes, which are all main factors causing the deterioration of the quality and reliability of conventional packaged products utilizing wire bonding technology.

Thus alloy wires and manufacturing methods thereof are required to solve the described problems.

BRIEF SUMMARY OF THE INVENTION

An embodiment of the invention provides a copper-based alloy wire made of a material selected from the group consisting of a copper-gold alloy, a copper-palladium alloy and a copper-gold-palladium alloy. The alloy wire has a polycrystalline structure of a face-centered cubic phase and consists of a plurality of equi-axial grains. The quantity of grains comprising annealing twins was 10 percent or more of the total quantity of the grains of the alloy wire.

In the copper-based alloy wire, it is preferred that the copper-gold alloy comprises 0.01 to 30.00 weight percent of gold and a balance of copper, the copper-palladium alloy comprises 0.01 to 10.00 weight percent of palladium and a balance of copper, and the copper-gold-palladium alloy comprises 0.01 to 30.00 weight percent of gold, 0.01 to 10.00 weight percent of palladium and a balance of copper.

The wire diameter of the copper-based alloy wire is preferably between 10 µm and 300 µm.

An embodiment of the invention provides a copper-based alloy wire comprising a base wire and one or more layers of a metal coating. The base wire is made of a material selected from the group consisting of a copper-gold alloy, a copper-palladium alloy and a copper-gold-palladium alloy. The base wire has a polycrystalline structure of a face-centered cubic phase and consists of a plurality of equi-axial grains. The quantity of grains comprising annealing twins is 10 percent or more of the total quantity of the grains of the base wire. One or more layers of the metal coating are plated overlying the base wire. The metal coating is made of a material selected from the group consisting of substantially pure gold, substantially pure palladium and a gold-palladium alloy.

In the copper-based alloy wire, it is preferred that the copper-gold alloy comprises 0.01 to 30.00 weight percent of gold and a balance of copper, the copper-palladium alloy comprises 0.01 to 10.00 weight percent of palladium and a balance of copper, and the copper-gold-palladium alloy comprises 0.01 to 30.00 weight percent of gold, 0.01 to 10.00 weight percent of palladium and a balance of copper.

The wire diameter of the copper-based alloy wire is preferably between 10 µm and 300 µm. The metal coating is preferably between 0.1 µm and 10 µm thick.

An embodiment of the invention provides a manufacturing method of a copper-based alloy wire. First, a pre-formed wire made of a material selected from the group consisting of a copper-gold alloy, a copper-palladium alloy and a copper-gold-palladium alloy is provided. Then, the wire diameter of the pre-formed wire is step-by-step decreased to form a final wire with a wire diameter less than that of the pre-formed wire utilizing N steps of cold-work shaping steps. In each of the (N−1)th and Nth steps of the cold-work shaping steps, the deformation is between 1% and 15% compared to an in-process wire from its immediately preceding cold-work shaping step, wherein N is a positive integer equal to 3 or greater. N steps of annealing steps are performed on the in-process wire respectively between each of the cold-work shaping steps and after the Nth step of the cold-work shaping steps. The (N−1)th step of the annealing steps between the (N−1)th and Nth steps of the cold-work shaping steps is performed at an annealing temperature of between 0.5×Tm and 0.7×Tm during an annealing period of between 1 second and 10 seconds, wherein Tm is the melting point in the Kelvin temperature scale of the material of the pre-formed wire. The Nth step of the annealing steps after the Nth step of the cold-work shaping steps is performed at an annealing temperature of between 30K (Kelvin temperature scale) and 50K higher than that of the (N−1)th step of the annealing steps during an annealing period of between 2 seconds and 60 seconds, resulting in the final wire having a polycrystalline structure of a face-centered cubic phase and consisting of a plurality of equi-axial grains, and forming annealing twins in at least some of the grains. The quantity of grains comprising the annealing twins is 10 percent or more of the total quantity of the grains of the fine wire.

In the manufacturing method of the copper-based alloy wire, the cold-work shaping steps are preferably wire-drawing steps, extrusion steps or a combination thereof.

In the manufacturing method of the copper-based alloy wire, it is preferred that each of the annealing steps is performed in a nitrogen atmosphere or another chemically inactive atmosphere.

In the manufacturing method of the copper-based alloy wire, the provision of the pre-formed wire may comprise the steps of melting raw materials of the material of the pre-formed wire, followed by casting to form an ingot, and performing cold work on the ingot to complete the pre-formed wire. The provision of the pre-formed wire may alternatively comprise the steps of melting raw materials of the material of the pre-formed wire, followed by a process of continuous casting to form the pre-formed wire.

In the manufacturing method of the copper-based alloy wire, the method preferably further comprises plating one or more layers of a metal coating overlying a surface of the pre-formed wire utilizing electrical plating, evaporation or sputtering prior to the cold-work shaping steps. The metal coating is preferably made of a material selected from the group consisting of substantially pure gold, substantially pure palladium and a gold-palladium alloy. The metal coating is preferably between 0.1 μm and 10 μm thick.

In the manufacturing method of the copper-based alloy wire, the method preferably further comprises plating one or more layers of a metal coating overlying a surface of the pre-formed wire utilizing electrical plating, evaporation or sputtering after the Nth step of the cold-work shaping steps. The metal coating is preferably made of a material selected from the group consisting of substantially pure gold, substantially pure palladium and a gold-palladium alloy. The metal coating is preferably between 0.1 μm and 10 μm thick.

In the manufacturing method of the copper-based alloy wire, it is preferred that the copper-gold alloy comprises 0.01 to 30.00 weight percent of gold and a balance of copper, the copper-palladium alloy comprises 0.01 to 10.00 weight percent of palladium and a balance of copper, and the copper-gold-palladium alloy comprises 0.01 to 30.00 weight percent of gold, 0.01 to 10.00 weight percent of palladium and a balance of copper.

In the manufacturing method of the copper-based alloy wire, the wire diameter of the pre-formed wire is preferably between 5 mm and 10 mm, and the wire diameter of the final wire is preferably between 10 μm and 300 μm.

Further scope of the applicability of the invention will become apparent from the detailed descriptions given hereinafter. It should be understood however, that the detailed descriptions and specific examples, while indicating preferred embodiments of the invention, are given by way of illustration only, as various changes and modifications within the spirit and scope of the invention will become apparent to those skilled in the Art from the detailed descriptions.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 1A and 1B show a copper-based alloy wire of a first embodiment of the invention, wherein FIG. 1A schematically shows a segment of the copper-based alloy wire of the first embodiment of the invention.

FIGS. 2A and 2B show a copper-based alloy wire of a second embodiment of the invention, wherein FIG. 2A schematically shows a segment of the copper-based alloy wire of the second embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Note that the concepts and specific practice modes of the invention are described in detail by the embodiments and the attached drawings. In the drawings or description, similar elements are indicated by similar reference numerals and/or letters. Further, the element shape or thickness in the drawings can be expanded for simplification or convenience of indication. Moreover, elements which are not shown or described can be in every form known by those skilled in the art.

It is understood that the following disclosure provides many different embodiments, or examples, for implementing different features of the invention. Specific examples of components and arrangements are described below to simplify the present disclosure. Note that these are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples.

In the subsequent description, phrases such as "substantially pure gold", "substantially pure palladium", etc. . . . mean expected to be pure gold, pure palladium, etc. without any impurities in design, as in practice, it is difficult to be mathematically or theoretically pure gold, pure palladium, etc. due to the practical limits of the smelting, refining and film-coating processes wherein it is nearly impossible to completely remove all impurities from raw materials. Additionally, when deviation is in an acceptable range of a corresponding standard or specification, it is also recognized to be pure gold, pure palladium, etc. Those skilled in the art are expected to acknowledge that different standards or specifications depend upon various properties and conditions, and thus cannot be specifically listed.

Specific embodiments of the invention for copper-based alloy wires and manufacturing methods thereof are described. It is noted that the concepts of the invention can be applied to any known or newly developed alloy wires and manufacturing methods thereof.

Figure 1A:
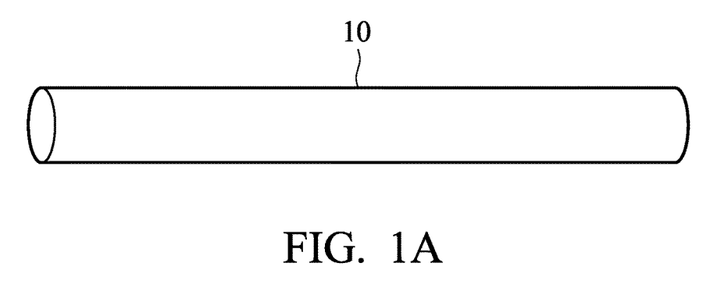
Figure 1B:
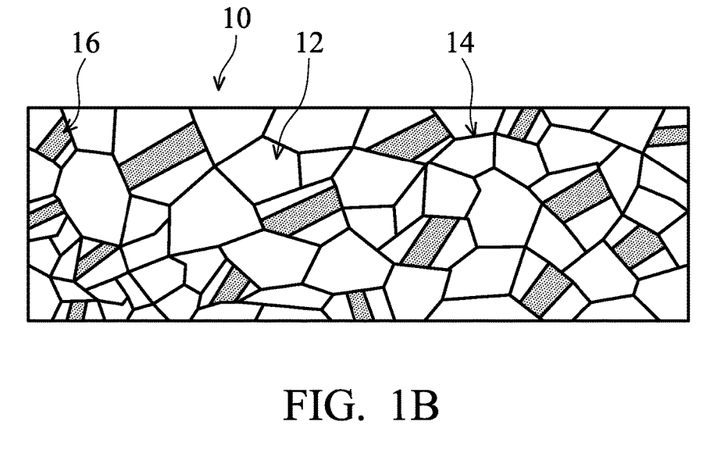
FIG. 1B is a lengthwise cross-section of the copper-based alloy wire shown in FIG. 1A along a direction parallel to the longitudinal direction of the copper-based alloy wire shown in FIG. 1A.

Referring to FIGS. 1A and 1B showing a copper-based alloy wire 10 of a first embodiment of the invention, FIG. 1A schematically shows a segment of the copper-based alloy wire 10, and FIG. 1B is a lengthwise cross-section of the copper-based alloy wire 10 shown in FIG. 1A along a direction parallel to the longitudinal direction of the copper-based alloy wire 10 shown in FIG. 1A.

As shown in FIG. 1A, the copper-based alloy wire 10 of the first embodiment of the invention is made of a material selected from the group consisting of a copper-gold alloy, a copper-palladium alloy and a copper-gold-palladium alloy. As shown in FIG. 1B, the lengthwise cross-section of the copper-based alloy wire 10 shows a polycrystalline structure of a face-centered cubic phase and the copper-based alloy wire 10 consisting of a plurality of grains. All of the grains are equi-axial grains 12. High-angle grain boundaries 14 are between every equi-axial grain 12. The quantity of grains comprising annealing twins 16 is 10 percent or more of the total quantity of the grains of the alloy wire 10.

Figure 2A:
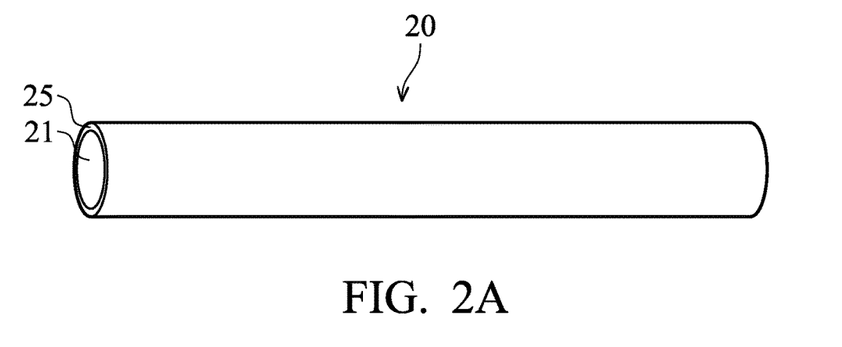
Figure 2B:
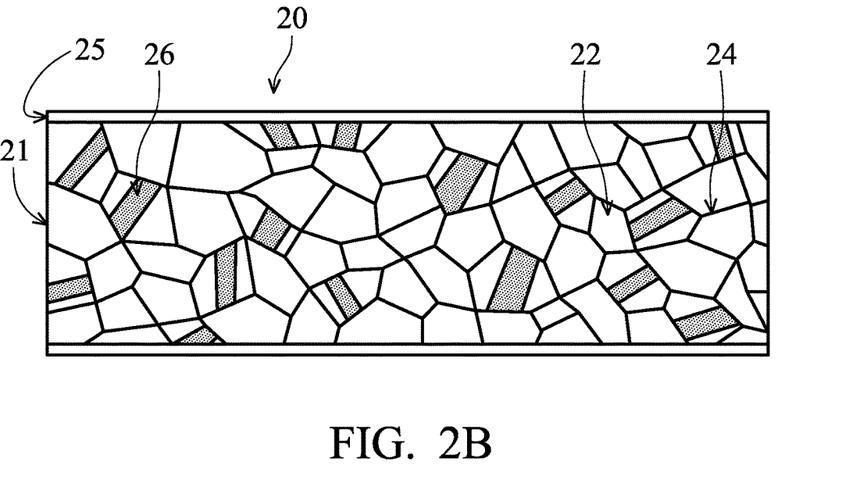
FIG. 2B is a lengthwise cross-section of the copper-based alloy wire shown in FIG. 2A along a direction parallel to the longitudinal direction of the copper-based alloy wire shown in FIG. 2A.

Next, referring to FIGS. 2A and 2B showing a copper-based alloy wire 20 of a second embodiment of the invention, FIG. 2A schematically shows a segment of the copper-based alloy wire 20 of the second embodiment of the invention, and FIG. 2B is a lengthwise cross-section of the copper-based alloy wire 20 shown in FIG. 2A along a direction parallel to the longitudinal direction of the copper-based alloy wire 20 shown in FIG. 2A.

A second embodiment of the invention provides a copper-based alloy wire 20 comprising a base wire 21 and a metal coating 25. The base wire 21 is made of a material selected from the group consisting of a copper-gold alloy, a copper-palladium alloy and a copper-gold-palladium alloy. The base wire 21 has a polycrystalline structure of a face-centered phase and comprises a plurality of grains, wherein all of the grains are equi-axial grains 22. High-angle grain boundaries 24 are between every equi-axial grain 22. The quantity of grains comprising annealing twins 26 is 10 percent or more of the total quantity of the grains of the base wire 21. The metal coating 25 is plated overlying the base wire 21. The metal coating 25 may be composed of one single layer or a plurality of layers of metal films. The metal coating 25 is made of a material selected from the group consisting of substantially pure gold, substantially pure palladium and a gold-palladium alloy. The base wire 21 covered by the metal coating 25 can be protected from corrosion due to the chemical inertness of the material of the metal coating 25. The metal coating 25 can also be utilized as a lubricant during wire-drawing steps. Moreover, the metal coating 25 is preferably between 0.1 μm and 10 μm thick. The grain structure of the metal coating 25 is not shown in FIG. 2B.

The copper-gold alloy, copper-palladium alloy and copper-gold-palladium alloy described in the whole specification mean alloys containing copper as a main composition with gold and/or palladium added thereto, wherein the content of gold and palladium are no greater than the content of copper acting as the main composition.

Furthermore, the wire diameter of the copper-based alloy wires 10 and 20 of the first and second embodiments of the invention are preferably between 10 μm and 300 μm, which are suitable for wires utilized in wire bonding for packages of electronic devices. It is particularly mentioned that the finer wires (10 μm to 50 μm) are popularly used in general IC and LED products, and the thicker wires (50 μm to 300 μm) are used in high power IC devices. Note that a user can also apply the inventive copper-based alloy wires to other technical fields and purposes, such as enameled wires, audio wires, signal or power transmission wires, voltage transformer wires, etc. as desired. The wire diameter of the inventive copper-based alloy wires may also be modified as desired, and is not limited in the described exemplary range.

One of the characteristics of the copper-based alloy wire of the invention is that the copper-based alloy wire has a polycrystalline structure and consists of a plurality of equi-axial grains. The average diameter of the grains is between 1 μm and 10 μm, slightly greater than the average diameter of conventional wire for wire-bonding which is between 0.5 μm and 3 μm. As a result, the density of the high-angle grain boundaries of the inventive copper-based alloy wire is decreased, reducing the drawbacks caused by plenty of high-angle grain boundaries between fine grains as described above. A more important characteristic of the copper-based alloy wire of the invention is that at least 10 percent of the grains of the inventive copper-based alloy wire comprise an annealing twin structure therein. The twin boundaries of the annealing twin structure are coherent crystal structures belonging to Σ3 special grain boundaries with low energy. The interfacial energy of the twin boundaries is only 5 percent of that of common high-angle grain boundaries (referring to George E. Dieter, Mechanical Metallurgy, McGRAW-HILL Book Company, 1976, P. 135-141). The lower interfacial energy of the twin boundaries prevents the twin boundaries from being paths for oxidation, sulfuration and chloride ion corrosion and thus provides better antioxidative activity and better corrosion resistance.

Further, the symmetrical lattice arrangement of the annealing twins provides little scattering for electron transmission, and thus provides better electrical conductivity and thermal conductivity. Such an effect was proved in a pulsed electrodeposited copper foils (referring to L. Lu, Y. Shen, X. Chen, L. Qian, and K. Lu, Ultrahigh Strength and High Electrical Conductivity in Copper, Science, vol. 304, 2004, p. 422-426). The twin boundaries of the low-energy twin structure are more stable than the common high-angle grain boundaries due to lower interfacial energy. At high temperatures, not only is it not easy to move the twin boundaries, but also the twin boundaries provide an anchor effect for the high-angle grain boundaries around the grains. As a result, the high-angle grain boundaries also cannot move, and no apparent grain growth occurs in the whole grain structure. Even when the first bond (ball bond) cools from the molten state to room temperature during wire bonding, the original grain size of the inventive copper-based alloy wire is still able to be kept, preventing a heat-affected zone from forming due to fast grain growth resulting from the solidification heat of the ball bond built up in the conventional fine grain structure metal wire near the ball bond, and preventing a decrease in strength resulting from the wire pull test. Additionally, the diffusion rate of atoms from or across the twin boundaries is extremely low, and the occurrence of the internal atom movement in the alloy wire introduced by high current density is quite difficult during utilization of the electronic products. Thus the electron migration problem occurring in conventional metal wires for wire bonding as described is solved. There is a publication proving that the twins can suppress the electron migration of the material in copper thin films (referring to K. C. Chen, W. W. Wu, C. N. Liao, L. J. Chen, and K. N. Tu, Observation of Atomic Diffusion at Twin-Modified Grain Boundaries in Copper, Science, vol. 321, 2008, p. 1066-1069.). To sum up, the copper-based alloy wire of the invention provides better quality and reliability than those of conventional copper wires when utilizing the copper-based alloy wire of the invention as a wire for wire bonding in products of integrated circuit devices and light-emitting diodes.

Further, it is necessary that at least 10 percent of the grains of the inventive copper-based alloy wire comprise an annealing twin structure therein to make the effects apparent. In conventional metal wires for wire bonding, the annealing twin structure may be found on rare occasions. However, the quantity of grains comprising the annealing twin structure is 10 percent or less of the total grains of the conventional wire. Thus conventional metal wires cannot provide the aforementioned effects provided by the alloy wire of the invention.

In more detail, although the grain size of the copper-based alloy wire of the invention is slightly greater than the grain size of conventional metal wires, the movement of dislocations can also be blocked to strengthen the material due to many of the grains in the copper-based alloy wire of the invention comprising annealing twins with different crystal orientations from that of the grains where the annealing twins are. The strengthening mechanism is different from that of conventional metal wires with fine grain structures requiring high-angle grain boundaries to block the movement of dislocations, but which introduce problems that negatively affect the wire bond quality and reliability. Further, the annealing twins are capable of blocking high-density dislocations, and thus can provide better ductility (referring to Lu, Y. Shen, X. Chen, L. Qian, and K. Lu, "Ultrahigh strength and high electrical conductivity in copper," *Science*, vol. 304, no. 16, pp. 422-426, 2004. & L. Lu, X. Chen, X. Huang, and K. Lu, "Revealing the maximum strength in nano-twinned copper," Science, vol. 323, pp. 607-610, 2009.). Thus the copper-based alloy wire for wire bonding comprising annealing twin structures of the invention may have a tensile strength similar to or greater than that of conventional metal wires comprising fine grain structures. However, the ductility of the copper-based alloy wire of the invention is higher than that of conventional metal wires because the dislocations can accumulate at the twin boundaries. Thus the mechanical properties of the copper-based alloy wire of the invention are better than those of conventional metal wires.

According to the mechanisms of Physical Metallurgy (referring to George E. Dieter, Mechanical Metallurgy, McGRAW-HILL Book Company, 1976, P. 135-141. and R. W. Cahn, Physical Metallurgy, 1970, P. 1184-1185), strain energy is built up in the material during cold work, and atoms in some regions in a grain are driven by the strain energy and thus uniformly shear to lattice locations forming mirror symmetry with the atoms which do not shear in the grain where the atoms are. As a result, the annealing twins are formed, and the symmetrical interfaces thereof are twin boundaries. The annealing twins mainly occur in materials with face centered cubic (FCC) lattices which are the densest in crystal lattice arrangement. The twin boundaries are $\Sigma 3$ special boundaries with low energy, and the crystal orientations thereof are all $\{111\}$ planes. Compared to the high-angle grain boundaries formed by common recrystallization due to annealing, the interfacial energy of the twin boundaries is only approximately 5 percent of that of the high-angle grain boundaries. In addition to the FCC lattice structure, generally it is easier to form the annealing twins in materials with less stacking-fault energy. The stacking-fault energies of copper, gold and palladium utilized in the copper-based alloy wire of the invention are respectively 70 erg/cm$^2$, 45 erg/cm$^2$ and 130 erg/cm$^2$, and the stacking-fault energies of the resulting copper-gold alloys, copper-palladium alloys and copper-gold-palladium alloys are less than that of pure copper, and thus it is easy to form the annealing twins in the copper-based alloy wire of the invention. Although aluminum and nickel are both materials with FCC lattice structures, it is much less likely to form annealing twins in aluminum and nickel because the stacking-fault energies of aluminum and nickel are respectively approximately 200 erg/cm$^2$ and approximately 225 erg/cm$^2$. As a result, aluminum, nickel and other elements with higher stacking-fault energies do not match the conditions of the copper-based alloy wire of the invention.

The copper-based alloy wire of the invention is made of a material selected from the group consisting of a copper-gold alloy, a copper-palladium alloy and a copper-gold-palladium alloy. The stacking-fault energies of the copper-gold alloy, the copper-palladium alloy and the copper-gold-palladium alloy are all less than 70 erg/cm$^2$, independent from the copper content, gold content and palladium content therein. It is preferred that the copper-gold alloy comprises 0.01 to 30.00 weight percent of gold and a balance of copper, the copper-palladium alloy comprises 0.01 to 10.00 weight percent of palladium and a balance of copper, and the copper-gold-palladium alloy comprises 0.01 to 30.00 weight percent of gold, 0.01 to 10.00 weight percent of palladium and a balance of copper when considering other factors such as raw material cost, availability, segregation during cast, formability during wire drawing, resistance to oxidation, tensile strength, hardness, ductility, ball bond quality in wire bonding, bonding strength, etc.

Further, cold-work deformation before the annealing treatment is also a critical condition. Strain energy built up by sufficient cold-work deformation can drive atoms to form annealing twins. However, if the cold-work deformation is too much, plenty of nuclei of recrystallized grains will be induced early in the primary recrystallization stage of the annealing treatment. Thus a lot of fine grains are formed, and it is less possible to form annealing twins. In contrast, a structure of conventional metal wires is formed. Moreover, in all conventional methods of manufacturing metal wires, a plurality of continuous cold-work shaping steps are utilized to step-by-step decrease the wire diameter of a pre-formed wire to a final wire diameter, followed by performance of only one annealing step after the final wire diameter is achieved. Because there is only one chance to form annealing twins, even a copper wire with low stacking-fault energy matching the formation conditions of annealing twins, the quantity of grains comprising annealing twins is typically less than 5 percent or zero percent of the total quantity of the grains of the resulting grain structure (with reference to F. Y. Hung, T. S. Lui, L. H. Chen and Y. C. Lin: Recrystallization, Electric Flame-Off Characteristics, and Electron Backscatter Diffraction of Copper Bonding Wires, IEEE Transactions on Advanced Packaging, Vol. 33, No. 1, February 2010, PP. 58-63). As a result, the resulting wires manufactured by conventional methods cannot display the advantageous properties such as those provided by the copper-based alloy wire of the invention.

The invention further provides a manufacturing method of a copper-based alloy wire with alternative cold-work shaping steps and annealing steps, differing from conventional methods. In the first cold-work shaping step and the following first annealing step, a few annealing twins are formed. The initial annealing twins do not vanish during the following cold-work shaping steps because annealing twins have stable twin boundaries. The following cold-work shaping steps can provide further strain energy acting as driving force for atoms to form new annealing twins. Thus repeating a plurality of groups of one cold-work shaping step and the following one annealing step, plenty of annealing twins are sequentially formed. As a result, a copper-based alloy wire with a grain structure such that the quantity of grains comprising annealing twins is 10 percent or more of the total quantity of the grains of the copper-based alloy wire is complete.

Figure 3:
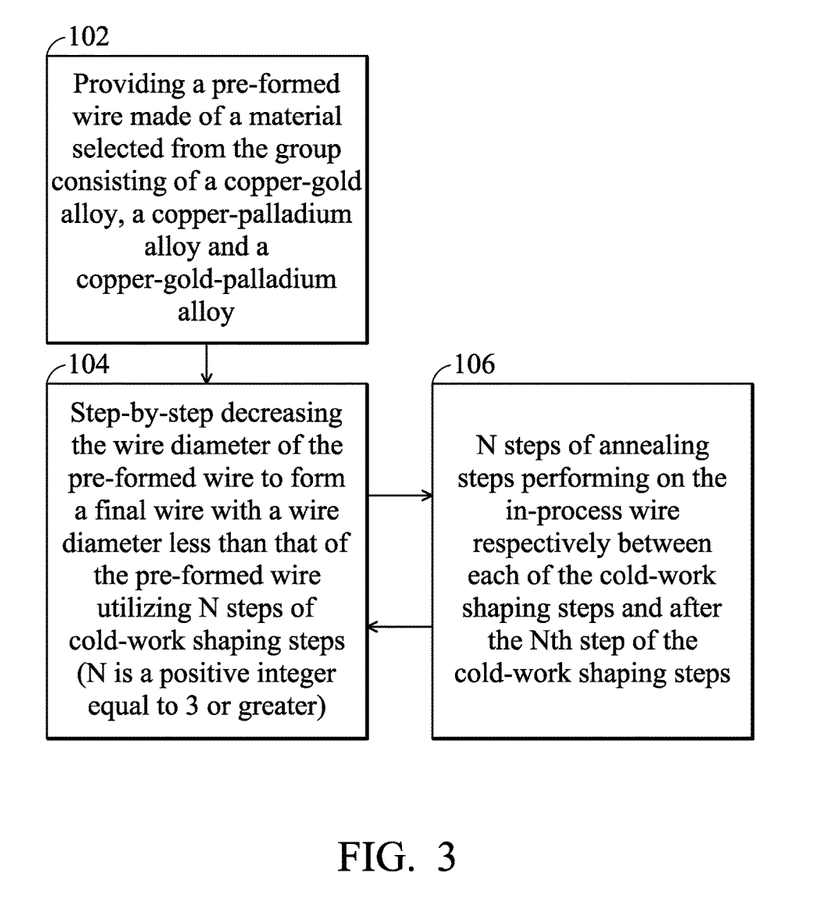
FIG. 3 is a flow chart showing an example of a manufacturing method of the copper-based alloy wire of the first embodiment of the invention.

Thus, referring to the flow chart shown in FIG. 3, an example of the manufacturing method of the copper-based alloy wire of the first embodiment of the invention may comprise the subsequent steps 102, 104 and 106.

In step 102, a pre-formed wire made of a material selected from the group consisting of a copper-gold alloy, a copper-palladium alloy and a copper-gold-palladium alloy is provided.

In step 104, the wire diameter of the pre-formed wire is step-by-step decreased to form a final wire with a wire diameter less than that of the pre-formed wire utilizing N steps of cold-work shaping steps. In each of the (N−1)th and Nth steps of the cold-work shaping steps, the deformation is between 1% and 15% compared to an in-process wire from its immediately preceding cold-work shaping step, wherein N is a positive integer equal to 3 or greater.

In step 106, N steps of annealing steps are performed on the in-process wire respectively between each of the cold-work shaping steps and after the Nth step of the cold-work shaping steps. The (N−1)th step of the annealing steps between the (N−1)th and Nth steps of the cold-work shaping steps is performed at an annealing temperature of between 0.5 Tm and 0.7 Tm during an annealing period of between 1 second and 10 seconds, wherein Tm is the melting point in the Kelvin temperature scale of the material of the pre-formed wire. The Nth step of the annealing steps after the Nth step of the cold-work shaping steps is performed at an annealing temperature of between 30K and 50K higher than that of the (N−1)th step of the annealing steps during an annealing period of between 2 seconds and 60 seconds.

Steps 102, 104 and 106 result in the final wire having a polycrystalline structure of a face-centered cubic phase and consisting of a plurality of equi-axial grains, and forming annealing twins in at least some of the grains. The quantity of grains comprising the annealing twins is 10 percent or more of the total quantity of the grains of the final wire.

Further, in the N steps of annealing steps described in step 106, an annealing apparatus the same as that utilized in manufacturing conventional metal wires may be utilized. The step quantity and the annealing conditions of the other annealing steps before the (N−1)th annealing step can be properly determined according to requirements, apparatus conditions and/or other factors while the condition that "N is a positive integer equal to 3 or greater" is not violated. Thus only the characteristic annealing conditions of the invention is described, and details regarding annealing apparatuses, annealing steps, and step quantity and annealing conditions of other annealing steps are abbreviated.

In the described steps, the wire diameter of the pre-formed wire is preferably between 5 mm and 10 mm, and the wire diameter of the final wire is preferably between 10 μm and 300 μm. Thus the alloy wire of the invention can be utilized for a wire for wire bonding as described.

In the described steps, the melting point Tm of the copper-gold alloy, the copper-palladium alloy and the copper-gold-palladium alloy acting as the material of the pre-formed wire is a temperature for the beginning of liquefying in the Kelvin temperature scale of the corresponding composition in the related equilibrium phase diagram.

In the described steps, the "deformation" means the reduction rate of the cross-sectional area of a material during cold work.

In step 106, it is preferred that each of the annealing steps is performed in a nitrogen atmosphere or another chemically inactive atmosphere.

Figure 4:
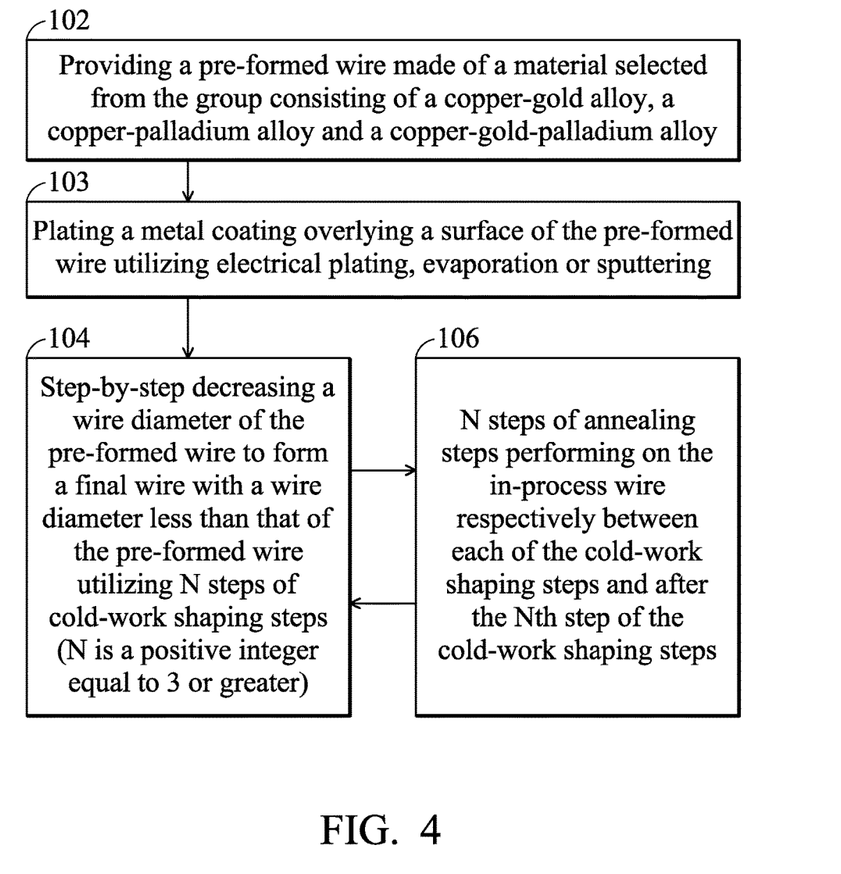
FIG. 4 is a flow chart showing an example of a manufacturing method of the copper-based alloy wire of the second embodiment of the invention.

Referring to the flow chart as shown in FIG. 4, an example of the manufacturing method of the copper-based alloy wire of the second embodiment of the invention may comprise steps 102, 103, 104 and 106, wherein steps 102, 104 and 106 are the same as those described in the example of the manufacturing method of the copper-based alloy wire of the first embodiment of the invention. Step 103 is performed prior to step 104 shown in FIG. 3. In step 103, one or more layers of a metal coating is plated overlying a surface of the pre-formed wire utilizing electrical plating, evaporation or sputtering. The metal coating is preferably made of a material selected from the group consisting of substantially pure gold, substantially pure palladium and a gold-palladium alloy. Further, the metal coating is preferably between 0.1 μm and 10 μm thick. As a result, the fabrication of the copper-based alloy wire of the second embodiment of the invention is completed.

Figure 5:
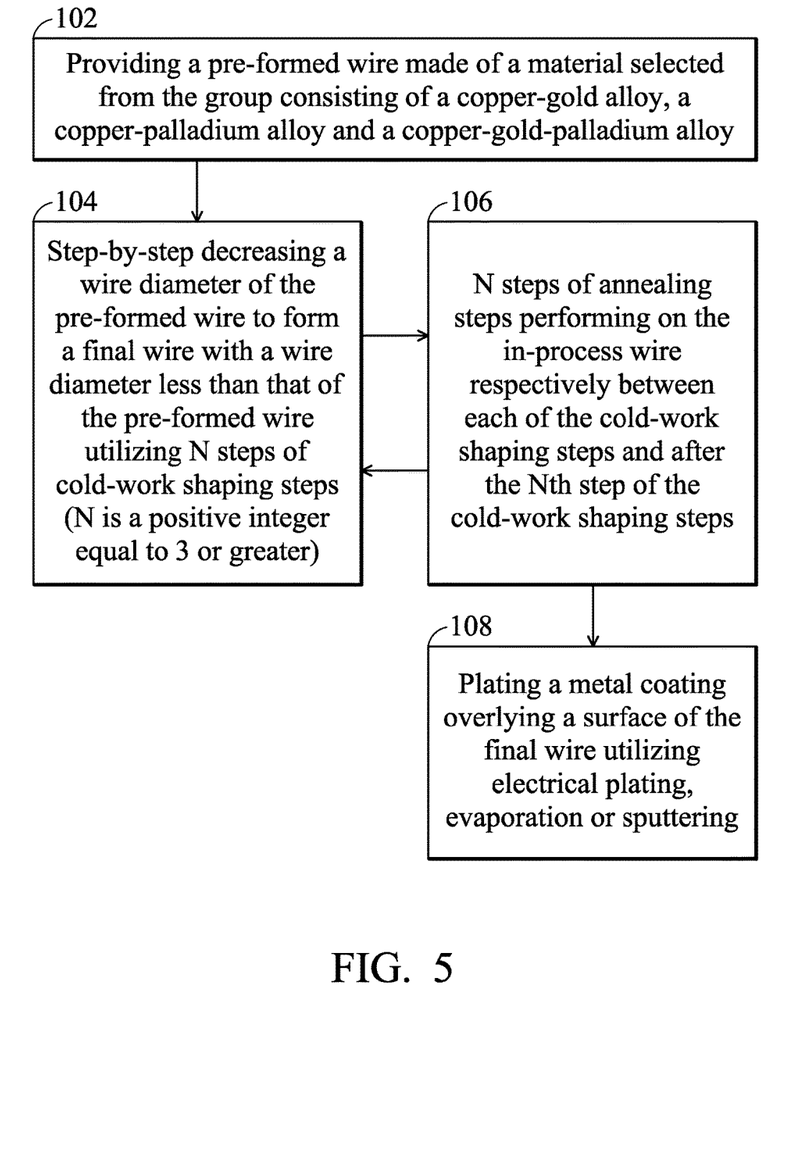
FIG. 5 is a flow chart showing another example of a manufacturing method of the copper-based alloy wire of the second embodiment of the invention.

Referring to the flow chart as shown in FIG. 5, another example of the manufacturing method of the copper-based alloy wire of the second embodiment of the invention may comprise steps 102, 104, 106 and 108, wherein steps 102, 104 and 106 are the same as those described in the example of the manufacturing method of the copper-based alloy wire of the first embodiment of the invention. Step 108 is performed after step 106 shown in FIG. 3. In step 108, one or more layers of a metal coating is plated overlying a surface of the final wire utilizing electrical plating, evaporation or sputtering. The metal coating is preferably made of a material selected from the group consisting of substantially pure gold, substantially pure palladium and a gold-palladium alloy. Further, the metal coating is preferably between 0.1 μm and 10 μm thick. As a result, the copper-based alloy wire of the second embodiment of the invention is completed.

In every described method, the cold-work shaping steps in step 104 are preferably wire-drawing steps, extrusion steps or a combination thereof.

Figure 6:
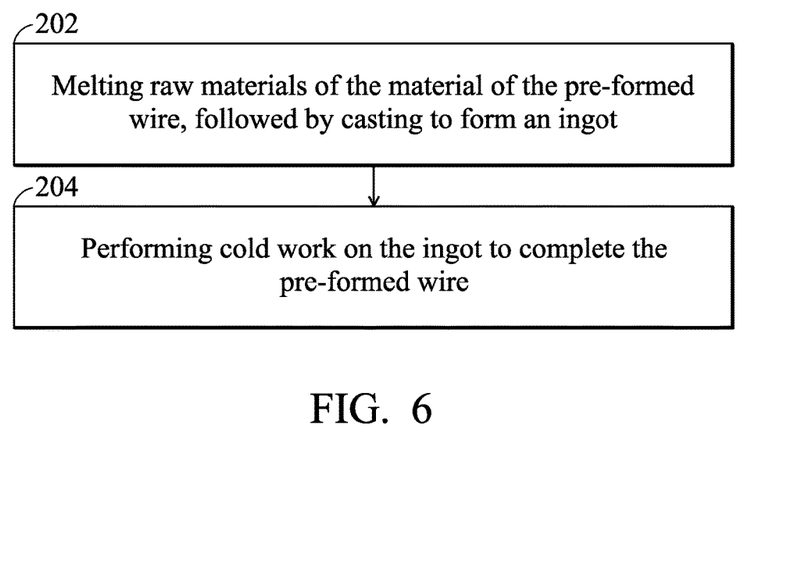
FIG. 6 is a flow chart showing an example of provision of the pre-formed wire in the flow charts shown in FIGS. 3-5.

In every described method, an example of a method of provision of the pre-formed wire preferably comprises the subsequent cast step 202 and cold work step 204 with reference to the flow chart shown in FIG. 6.

In the cast step 202, the raw materials of the material of the pre-formed wire are heated and melted, followed by casting to form an ingot.

In the cold work step 204, the step performs cold work on the ingot to complete the pre-formed wire. Similarly, the cold work step 204 can also be a wire-drawing step, an extrusion step or a combination thereof.

Figure 7:
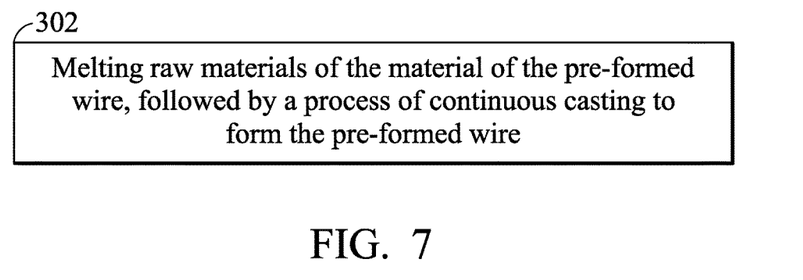
FIG. 7 schematically shows another example of provision of the pre-formed wire in the flow charts shown in FIGS. 3-5.

In every described method, another example of a method of provision of the pre-formed wire preferably comprises the subsequent continuous casting step 302 with reference to the schematic drawing shown in FIG. 7.

In the continuous casting step 302, the raw materials of the material of the pre-formed wire are heated and melted, followed by a process of continuous casting to form the pre-formed wire.

In the described methods, it is preferred that the copper-gold alloy comprises 0.01 to 30.00 weight percent of gold and a balance of copper, the copper-palladium alloy comprises 0.01 to 10.00 weight percent of palladium and a balance of copper, and the copper-gold-palladium alloy comprises 0.01 to 30.00 weight percent of gold, 0.01 to 10.00 weight percent of palladium and a balance of copper.

In addition to the conditions of the described manufacturing methods, if a wire matching the copper-based alloy wire of the invention described in the specification is manufactured by other methods such as different cold-work methods, different cold-work deformation, different annealing conditions, etc., the wire is also comprised in the scope of the invention.

The inventors studied hard for a long period of time and discovered suitable cold-work deformation conditions, collocating optimum annealing temperatures and annealing periods, completing a novel copper-based alloy wire comprising a lot of annealing twins therein according to alternative cold-work shaping steps and annealing steps. The novel copper-based alloy wire provides high electrical conductivity, high thermal conductivity, excellent antioxidative activity and excellent corrosion resistance. It is most interesting that the twin boundaries can effectively suppress electron migration. The twin boundaries provide an anchor effect for the high-angle grain boundaries around the grains, and thus it is not easy to move the high-angle grain boundaries. Therefore, grain growth is suppressed, and almost no heat-affected zone is formed. In addition, annealing twins can also block the movement of dislocations because the crystal orientation of the annealing twins is different from the grain where the annealing twins are, and thus provide a strengthening effect for the material. Moreover, the annealing twins can block high-density dislocations, and thus provide better ductility. Therefore, the tensile strength of the copper-based alloy wire of the invention is similar to or higher than that of conventional metal wires, but the ductility of the copper-based alloy wire of the invention is higher than that of conventional wires. The formation of enough annealing twins provides a result different from the common Physical Metallurgy mechanism in that the ductility of a material decreases while the strength of the material increases. These advantages provide excellent results in reliability tests for packaged integrated circuit devices and light-emitting diodes with wire bonding utilizing the alloy wire comprising a lot of annealing twins.

Example 1

A copper-1 wt % palladium alloy was smelted by high-frequency electric smelting, followed by continuous casting to form a pre-formed wire with a wire diameter of 6 mm. An initial wire-drawing step was then performed on the pre-formed wire to form an in-process wire with a wire diameter of 1 mm. A gold film of 10 μm thick was plated on the surfaces of the in-process wire by electroplating. The in-process wire became an intermediate wire with a wire diameter of 22.6 μm after a plurality of alternative steps of wire drawing elongation and annealing treatment, followed by performance of the second-last step of wire drawing elongation, becoming an intermediate wire with a wire diameter of 20 μm. Next, the intermediate wire was annealed at 530° C. for 1.5 seconds, followed by performance of the last step of wire drawing elongation, becoming a final wire with a wire diameter of 17.5 μm. Finally, the last step of the annealing treatment was performed on the fine wire at an annealing temperature of 570° C. for 4.8 seconds. Completing the last step of the annealing treatment, the final wire was wound, and then an alloy wire product for wire bonding was complete. Moreover, all the described annealing steps were performed under a chemically inactive atmosphere of nitrogen.

A photograph of the metallographic structure along a lengthwise cross-section of the inventive copper-based alloy wire of example 1 showed that all of the inventive copper-based alloy wire consisted of equi-axial grains with a grain size of approximately 6 μm, wherein the quantity of grains comprising annealing twins was approximately 24 percent of the total quantity of the grains of the inventive copper-based alloy wire. However, in a conventional copper wire, the quantity of grains comprising annealing twins was merely approximately 3 percent of the total quantity of the grains of the conventional copper wire. Even when conventional copper wire is annealed at different temperatures between 225° C. and 300° C. for one hour, the annealing twins do not apparently increase (with reference to F. Y. Hung, T. S. Lui, L. H. Chen and Y. C. Lin: Recrystallization, Electric Flame-Off Characteristics, and Electron Backscatter Diffraction of Copper Bonding Wires, IEEE Transactions on Advanced Packaging, Vol. 33, No. 1, February 2010, PP. 58-63).

In order to verify the excellent performance provided by the copper-based alloy wire having plenty of annealing twin structures of the invention to give a full display of the improved performance of the invention, first, a tensile test was performed. The test results showed that the tensile strength of the copper-1 wt % palladium alloy wire with gold film plated on the surfaces and with plenty of annealing twin structures of example 1 of the invention was approximately 12.1 g, which was slightly greater than the tensile strength (10.7 g) of the conventional copper wire. In typical materials, an increase in strength causes a decrease in ductility.

However, the elongation of the copper-based alloy wire of example 1 was 4.8%, slightly higher than that (4.6%) of a conventional copper wire with palladium coating due to the existence of plenty of annealing twins in the copper-based alloy wire of example 1.

In typical materials, an increase in strength also causes a decrease in conductivity. However, an electrical property test showed the average value of the copper-1 wt % palladium alloy wire with gold film plated on the surfaces and with plenty of annealing twin structures of example 1 of the invention to be approximately 2.0 μΩ·cm, close to that (1.9 μΩ·cm) of a conventional copper wire with palladium coating.

The copper-1 wt % palladium alloy wire with gold film plated on the surfaces and with plenty of annealing twin structures of example 1 of the invention was utilized in a wire bonding process to perform ball forming of the first bond of wire bonding, and the result showed the extension length of the heat-affected zone from the first bond along the longitudinal direction of the copper-1 wt % palladium alloy wire with gold film plated on the surfaces was only approximately 12 μm, and the grain size growth in the heat-affected zone was approximately 1.8 times that of the original grain size. When conventional copper wire with palladium coating is utilized in a wire bonding process to perform ball forming of the first bond of wire bonding, the extension length of the heat-affected zone from the first bond along the longitudinal direction of the conventional copper wire with palladium coating is greater than 20 μm, and the grain size growth in the heat-affected zone exceeds 10 times that of the original grain size. Compared to the performance of the conventional copper wire with palladium coating, the heat-affected zone of the copper-1 wt % palladium alloy wire with gold film plated on the surfaces and with plenty of annealing twin structures of example 1 of the invention was extremely small and the grain growth during wire bonding almost did not deteriorate the strength of the ball bond.

Semiconductor devices completed by a process utilizing the copper-1 wt % palladium alloy wire with gold film plated on the surfaces and with plenty of annealing twin structures of example 1 of the invention experienced a series of reliability tests. The results are shown in Table 1 and match the specifications of the reliability test for common electronic products.

TABLE 1

| TEST ITEM | TEST CONDITION | RESULT |
|---|---|---|
| 1. Precondition Test | baking (125 + 5-0° C., 24 hours) temperature and humidity test (30° C, 60% RH, 192 hours) Reflow: (260 + 0/−5° C., 3times) | passed |
| 2. Pressure Cooker Test; PCT | Ta = 121° C., 100% RH, 2 atm 96 hours | passed |
| 3. Temperature Cycling Test; TCT | Ta = −65° C.~150° C. (air-to-air thermal shock), 15 minutes/chamber 1000 cycles | passed |
| 4. Temperature & Humidity Test; THT | Ta = 85° C., 85% RH, no bias 1000 hours | passed |
| 5. High Temperature Storage Test; HTST | Ta = 150° C. 1000 hours | passed |
| 6. Low Temperature Storage Test; LTST | Ta = −40° C. 1000 hours | passed |
| 7. Solderability test | Steam aging: 93° C., 8 hours, Soldering dip: 245° C., 5 seconds | passed |
| 8. Highly Accelerated Stress Test; HAST | Ta = 148° C., 90% RH, bias of 3.6voltage 96 hours | passed |
| 9. Thermal shock Test; TST | Ta = −65° C.~150° C., 5 minutes/chamber 1000 cycles | passed |

Example 2

A copper-1 wt % gold-2 wt % palladium alloy was smelted by high-frequency electric smelting, followed by continuous casting to form a pre-formed wire with a wire diameter of 6 mm. The pre-formed wire became an intermediate wire with a wire diameter of 22.6 μm after a plurality of alternative steps of wire drawing elongation and annealing treatment, followed by performance of the second-last step of wire drawing elongation, becoming an intermediate wire with a wire diameter of 20 μm. Next, the intermediate wire was annealed at 530° C. for 1.5 seconds, followed by performance of the last step of wire drawing elongation, becoming a final wire with a wire diameter of 17.5 μm. Finally, the last step of the annealing treatment was performed on the final wire at an annealing temperature of 570° C. for 4.8 seconds. Completing the last step of the annealing treatment, the final wire was wound, and then an alloy wire product for wire bonding was complete. Moreover, all the described annealing steps were performed under a chemically inactive atmosphere of nitrogen.

A photograph of the metallographic structure along a lengthwise cross-section of the inventive copper-1 wt % gold-2 wt % palladium alloy wire of example 2 showed that all of the inventive copper-based alloy wire consisted of equi-axial grains with a grain size of approximately 5 μm, wherein the quantity of grains comprising annealing twins was approximately 28 percent of the total quantity of the grains of the inventive copper-based alloy wire. However, in a conventional copper wire, the quantity of grains comprising annealing twins was merely approximately 3 percent of the total quantity of the grains of the conventional copper wire. Even when conventional copper wire is annealed at different temperatures between 225° C. and 300° C. for one hour, the annealing twins do not apparently increase (with reference to F. Y. Hung, T. S. Lui, L. H. Chen and Y. C. Lin: Recrystallization, Electric Flame-Off Characteristics, and Electron Backscatter Diffraction of Copper Bonding Wires, IEEE Transactions on Advanced Packaging, Vol. 33, No. 1, February 2010, PP. 58-63).

In order to verify the excellent performance provided by the copper-based alloy wire having plenty of annealing twin structures of the invention to give a full display of the improved performance of the invention, first, a tensile test was performed. The test results showed that the tensile strength of the copper-1 wt % gold-2 wt % palladium alloy wire with plenty of annealing twin structures of example 2 of the invention was approximately 15.7 g, which was much greater than the tensile strength (10.7 g) of the conventional copper wire. In typical materials, an increase in strength causes a decrease in ductility. However, the elongation of the copper-based alloy wire of example 2 was 4.2%, merely slightly lower than that (4.6%) of a conventional copper wire with palladium coating due to the existence of plenty of annealing twins in the copper-based alloy wire of example 2.

In typical materials, an increase in strength also causes a decrease in conductivity. However, an electrical property test showed the average value of the copper-1 wt % gold-2 wt % palladium alloy wire with plenty of annealing twin structures of example 2 of the invention to be approximately 3.2 μΩ·cm, slightly higher than that (1.9 μΩ·cm) of a conventional copper wire with palladium coating.

In order to verify the high temperature stability of the copper-1 wt % gold-2 wt % palladium alloy wire with plenty of annealing twin structures of example 2 of the invention, all kinds of the described wires were put in an air furnace that performed a heat treatment at 175° C. for 30 minutes. A photograph of the metallographic structure of the copper-1 wt % gold-2 wt % palladium alloy wire with plenty of annealing twin structures of example 2 of the invention showed that the grain size only slightly increased after the heat treatment. However, the conventional copper wire showed that the grain size abruptly increased as compared to the original fine grains. As a result, it was confirmed that the grain structure of the copper-based alloy wire of example 2 of the invention can block the movement of grain boundaries due to the existence of plenty of low-energy twins. Thus, compared to the conventional copper wire, the copper-based alloy wire of the example 2 of the invention exhibits excellent high-temperature stability relating to the formation of the heat-affected zone in the alloy wire after wire bonding and excellent reliability test performance.

The copper-1 wt % gold-2 wt % palladium alloy wire with plenty of annealing twin structures of example 2 of the invention was utilized in a wire bonding process to perform ball forming of the first bond of wire bonding, and the result showed the extension length of the heat-affected zone from the first bond along the longitudinal direction of the copper-1 wt % palladium alloy wire was only approximately 10 μm, and the grain size growth in the heat-affected zone was approximately 1.5 times that of the original grain size. When the conventional copper wire with palladium coating is utilized in a wire bonding process to perform ball forming of the first bond of wire bonding, the extension length of the heat-affected zone from the first bond along the longitudinal direction of the conventional copper wire with palladium coating is greater than 20 μm, and the grain size growth in the heat-affected zone exceeds 10 times that of the original grain size. Compared to the performance of the conventional copper wire with palladium coating, the heat-affected zone of the copper-1 wt % gold-2 wt % palladium alloy wire with plenty of annealing twin structures of example 2 of the invention was extremely small and the grain growth during wire bonding almost did not deteriorate the strength of the ball bond.

Semiconductor devices completed by a process utilizing the copper-1 wt % gold-2 wt % palladium alloy wire with plenty of annealing twin structures of example 2 of the invention experienced a series of reliability tests as listed in Table 1, and the test results matched the specifications of the reliability test for common electronic products.

While the invention has been described by way of example and in terms of preferred embodiment, it is to be understood that the invention is not limited thereto. On the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A copper-based alloy wire, comprising:
   a base wire made of a copper-gold-palladium alloy, wherein the base wire has a polycrystalline structure of a face-centered cubic phase and consists of a plurality of equi-axial grains, and the quantity of grains comprising annealing twins is 10 percent or more of the total quantity of the grains of the base wire; and
   one or more layers of a metal-plated coating overlying the base wire, wherein the metal coating is made of a material selected from the group consisting of substantially pure gold, substantially pure palladium and a gold-palladium alloy;
   wherein the base wire is formed by:
   providing a pre-formed wire made of a material selected from the group consisting of a copper-gold alloy, a copper-palladium alloy and a copper-gold-palladium alloy;
   step-by-step decreasing the wire diameter of the pre-formed wire to form a final wire with a wire diameter less than that of the pre-formed wire utilizing N steps of cold-work shaping steps, wherein in each of the (N−1)th and Nth steps of the cold-work shaping steps, the deformation is between 1% and 15% compared to an in-process wire from its immediately preceding cold-work shaping step, and wherein N is a positive integer equal to 3 or greater; and
   N steps of annealing steps performed on the in-process wire respectively between each of the cold-work shaping steps and after the Nth step of the cold-work shaping steps, wherein
   the (N−1)th step of the annealing steps between the (N−1)th and Nth steps of the cold-work shaping steps is performed at an annealing temperature of between $0.5T_m$ and $0.7T_m$ during an annealing period of between 1 second and 10 seconds, wherein $T_m$ is the melting point in the Kelvin temperature scale of the material of the pre-formed wire; and
   the Nth step of the annealing steps after the Nth step of the cold-work shaping steps is performed at an annealing temperature of between 30K and 50K higher than that of the (N−1)th step of the annealing steps during an annealing period of between 2 seconds and 60 seconds, resulting in the final wire.

2. The copper-based alloy wire as claimed in claim 1, wherein
   the copper-gold-palladium alloy comprises 0.01 to 30.00 weight percent of gold, 0.01 to 10.00 weight percent of palladium and a balance of copper.

3. The copper-based alloy wire as claimed in claim 1, wherein the wire diameter of the copper-based alloy wire is between 10 μm and 300 μm.

4. The copper-based alloy wire as claimed in claim 2, wherein the wire diameter of the copper-based alloy wire is between 10 μm and 300 μm.

5. The copper-based alloy wire as claimed in claim 1, wherein the metal coating is between 0.1 μm and 10 μm thick.

6. A manufacturing method of the copper-based alloy wire of claim 1, comprising:
   performing the steps of the process for forming the base wire as recited in claim 1; and
   plating a metal coating overlying a surface of the pre-formed wire utilizing electrical plating, evaporation or sputtering.

7. The method as claimed in claim 6, wherein the cold-work shaping steps are wire-drawing steps, extrusion steps or a combination thereof.

8. The method as claimed in claim 6, wherein each of the annealing steps is performed in a nitrogen atmosphere.

9. The method as claimed in claim 6, wherein the provision of the pre-formed wire comprises the steps of:
   melting raw materials of the material of the pre-formed wire, followed by casting to form an ingot; and
   performing cold work on the ingot to complete the pre-formed wire.

10. The method as claimed in claim 6, wherein the provision of the pre-formed wire comprises the steps of melting raw materials of the material of the pre-formed wire, followed by a process of continuous casting to form the pre-formed wire.

11. The method as claimed in claim 6, wherein the plating the metal coating overlying a surface of the pre-formed wire is prior to the cold-work shaping steps, wherein the metal coating is made of a material selected from the group consisting of substantially pure gold, substantially pure palladium and a gold-palladium alloy.

12. The method as claimed in claim 11, wherein the metal coating is between 0.1 μm and 10 μm thick.

13. The method as claimed in claim 6, wherein the plating the metal coating overlying a surface of the pre-formed wire is after the Nth step of the cold-work shaping steps, wherein the metal coating is made of a material selected from the group consisting of substantially pure gold, substantially pure palladium and a gold-palladium alloy.

14. The method as claimed in claim 13, wherein the metal coating is between 0.1 μm and 10 μm thick.

15. The method as claimed in claim 6, wherein the copper-gold-palladium alloy comprises 0.01 to 30.00 weight percent of gold, 0.01 to 10.00 weight percent of palladium and a balance of copper.

16. The method as claimed in claim 6, wherein the wire diameter of the pre-formed wire is between 5 mm and 10 mm, and the wire diameter of the final wire is between 10 μm and 300 μm.

\* \* \* \* \*